US010923530B2

(12) United States Patent
Hugon et al.

(10) Patent No.: US 10,923,530 B2
(45) Date of Patent: Feb. 16, 2021

(54) OPTOELECTRONIC DEVICE WITH LIGHT-EMITTING DIODES

(71) Applicant: Aledia, Grenoble (FR)

(72) Inventors: Xavier Hugon, Teche (FR); Ivan-Christophe Robin, Grenoble (FR)

(73) Assignee: Aledia, Echirolles (FR)

( * ) Notice: Subject to any disclaimer, the term of this patent is extended or adjusted under 35 U.S.C. 154(b) by 0 days.

(21) Appl. No.: 16/706,327

(22) Filed: Dec. 6, 2019

(65) Prior Publication Data
US 2020/0111833 A1    Apr. 9, 2020

Related U.S. Application Data

(63) Continuation of application No. 16/112,490, filed on Aug. 24, 2018, now Pat. No. 10,535,709, which is a
(Continued)

(30) Foreign Application Priority Data

Dec. 30, 2014    (FR) ...................................... 14 63420

(51) Int. Cl.
*H01L 27/15*    (2006.01)
*H01L 33/24*    (2010.01)
(Continued)

(52) U.S. Cl.
CPC ........ *H01L 27/156* (2013.01); *H01L 33/0075* (2013.01); *H01L 33/0083* (2013.01);
(Continued)

(58) Field of Classification Search
None
See application file for complete search history.

(56) References Cited

U.S. PATENT DOCUMENTS 8,624,968 B1 * 1/2014 Hersee ................... B82Y 15/00
                                                        348/79
10,084,012 B2    9/2018 Hugon
(Continued)

FOREIGN PATENT DOCUMENTS

WO    WO 2014/044960 A1    3/2014
WO    WO 2014/140505 A1    9/2014
WO    WO 2014/184487 A1    11/2014

OTHER PUBLICATIONS

International Search Report and Written Opinion for International Application No. PCT/FR2015/053754, dated Mar. 10, 2016.

*Primary Examiner* — Sitaramarao S Yechuri
(74) *Attorney, Agent, or Firm* — Wolf, Greenfield & Sacks, P.C.

(57) ABSTRACT

An optoelectronic device including a substrate with first and second opposite surfaces; and electrical insulation side elements extending from the first surface to the second surface and defining, within the substrate, first semi-conductive or conductive portions which are electrically insulated from each other. The optoelectronic device also includes, for each first portion a first conductive contact pad on the second surface in contact with the first portion and a set of light-emitting diodes resting on the first surface and electrically connected to the first portion. The optoelectronic device also includes a conductive, at least partially transparent electrode layer covering all the light-emitting diodes; an insulating, at least partially transparent encapsulation layer covering the electrode layer; and at least one second conductive contact pad electrically connected to the electrode layer.

24 Claims, 8 Drawing Sheets

Related U.S. Application Data continuation-in-part of application No. 15/539,373, filed as application No. PCT/FR2015/053754 on Dec. 24, 2015, now Pat. No. 10,084,012.

(51) Int. Cl.

| | | |
|---|---|---|
| *H01L 33/32* | (2010.01) | |
| *H01L 33/28* | (2010.01) | |
| *H01L 33/40* | (2010.01) | |
| *H01L 33/42* | (2010.01) | |
| *H01L 33/50* | (2010.01) | |
| *H01L 33/56* | (2010.01) | |
| *H01L 33/58* | (2010.01) | |
| *H01L 33/00* | (2010.01) | |
| *H01L 33/06* | (2010.01) | |
| *H01L 33/62* | (2010.01) | |
| *H01L 25/16* | (2006.01) | |

(52) U.S. Cl.
CPC .............. *H01L 33/06* (2013.01); *H01L 33/24* (2013.01); *H01L 33/28* (2013.01); *H01L 33/32* (2013.01); *H01L 33/405* (2013.01); *H01L 33/42* (2013.01); *H01L 33/502* (2013.01); *H01L 33/56* (2013.01); *H01L 33/58* (2013.01); *H01L 25/167* (2013.01); *H01L 33/0093* (2020.05); *H01L 33/62* (2013.01); *H01L 2933/005* (2013.01); *H01L 2933/0016* (2013.01); *H01L 2933/0041* (2013.01); *H01L 2933/0058* (2013.01); *H01L 2933/0066* (2013.01)

(56) References Cited

U.S. PATENT DOCUMENTS

| | | |
|---|---|---|
| 10,535,709 B2 | 1/2020 | Hugon et al. |
| 2006/0175621 A1* | 8/2006 | Ohtsuka ................ H01L 27/156 257/88 |
| 2007/0080360 A1 | 4/2007 | Mirsky et al. |
| 2009/0085128 A1* | 4/2009 | Nakamura ...... H01L 21/823481 257/396 |
| 2009/0261356 A1 | 10/2009 | Lee et al. |
| 2011/0012164 A1 | 1/2011 | Kim |
| 2011/0136288 A1 | 6/2011 | Duane et al. |
| 2011/0140072 A1* | 6/2011 | Varangis ................ B82Y 20/00 257/9 |
| 2011/0254034 A1* | 10/2011 | Konsek .................. B82Y 20/00 257/98 |
| 2012/0074441 A1 | 3/2012 | Seo et al. |
| 2012/0248408 A1 | 10/2012 | Paek et al. |
| 2014/0027796 A1* | 1/2014 | Nam .................. H01L 25/0753 257/88 |
| 2017/0373118 A1 | 12/2017 | Hugon |
| 2018/0366515 A1 | 12/2018 | Hugon et al. |

* cited by examiner

Fig 8M

OPTOELECTRONIC DEVICE WITH LIGHT-EMITTING DIODES

This application is a Continuation of U.S. application Ser. No. 16/112,490, filed Aug. 24, 2018, which is a Continuation-in-part of U.S. application Ser. No. 15/539,373, filed Jun. 23, 2017, currently pending, which claims priority under 35 U.S.C. § 371 of International Patent Application Serial No. PCT/FR2015/053754, filed Dec. 24, 2015, which claims priority to French patent application FR14/63420, filed Dec. 30, 2014. The entire contents of these applications are incorporated herein by reference in their entirety.

BACKGROUND

The present disclosure relates to an optoelectronic device comprising light-emitting diodes, particularly light-emitting diodes made of inorganic materials, for example, a display screen or an image projection device.

DISCUSSION OF THE RELATED ART

There exist optoelectronic devices, particularly display screens or projection devices, comprising light-emitting diodes based on semiconductor materials comprising a stack of semiconductor layers mainly comprising at least one group-III element and one group-V element, called III-V compound hereafter, particularly gallium nitride (GaN), gallium indium nitride (GaInN), and gallium aluminum nitride (GaAlN).

A pixel of an image corresponds to the unit element of the image displayed by a display screen or projected by a projection device. When the optoelectronic device is a monochrome image display screen or a monochrome image projection device, it generally comprises a single light source for the display of each pixel of the image. When the optoelectronic device is a color image display screen or a color image projection device, it generally comprises, for the display of each image pixel, at least three emission and/or light intensity regulation components, also called display sub-pixels, which each emit a light radiation substantially in a single color (for example, red, green, and blue). The superposition of the radiations emitted by the three display sub-pixels provides the observer with the colored sensation corresponding to the pixel of the displayed image. In this case, the assembly formed by the three display sub-pixels used for the display of an image pixel is called display pixel of the display screen or of the projection device.

Figure 1:
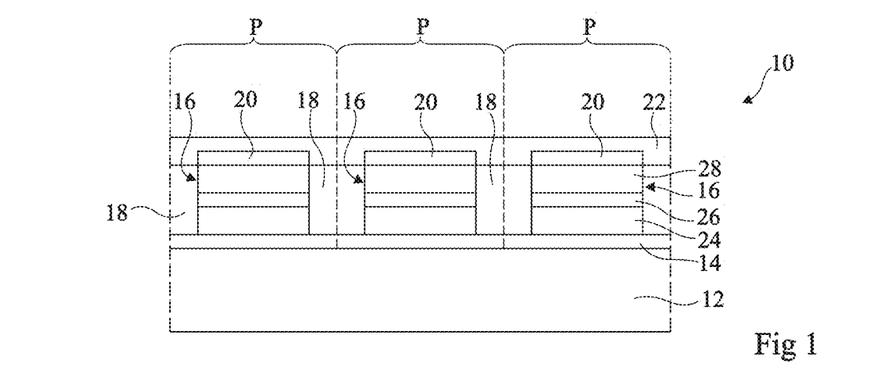
FIG. 1, previously described, is a partial simplified cross-section view of an example of an optoelectronic device comprising inorganic light-emitting diodes.

FIG. 1 shows an example of an optoelectronic device 10 comprising inorganic light-emitting diodes such as a display screen or a projection device. Optoelectronic device 10 successively comprises from bottom to top in FIG. 1:

a support 12;

lower electrodes 14, for example corresponding to parallel conductive strips;

inorganic light-emitting diodes 16 resting on lower electrodes 14 and separated from one another by insulating portions 18;

transparent upper electrodes 20 in contact with the upper surfaces of inorganic light-emitting diodes 16; and a transparent protection layer 22 covering the entire structure.

Phosphor layers and/or colored filters may be provided on protection layer 22.

Each inorganic light-emitting diode 16 comprises a stack of semiconductor portions successively comprising from bottom to top in FIG. 1:

a doped semiconductor portion 24 of a first conductivity type, for example, of type N, in contact with one of electrodes 14;

an active area 26, that is, the area of the light-emitting diode emitting most of the light radiation supplied by the light-emitting diode in operation, corresponding to a monolayer or multilayer structure comprising, for example, a non-doped semiconductor portion, a single quantum well, or multiple quantum wells; and a doped semiconductor portion 28 of a second conductivity type, opposite to the first conductivity type, for example, of type P, in contact with one of electrodes 20.

Such light-emitting diodes 16 are called two-dimensional since they are formed of a stack of thin and planar layers. Each display sub-pixel P of optoelectronic device 10 comprises a light-emitting diode 16, an insulating portion 18 surrounding light-emitting diode 16, and portions of one of electrodes 14 and of one of electrodes 20 in contact with light-emitting diode 16. As an example, the surface area taken up by each display sub-pixel P may correspond to a square having a side length in the range from 100 µm to 1 mm.

Figure 2A:
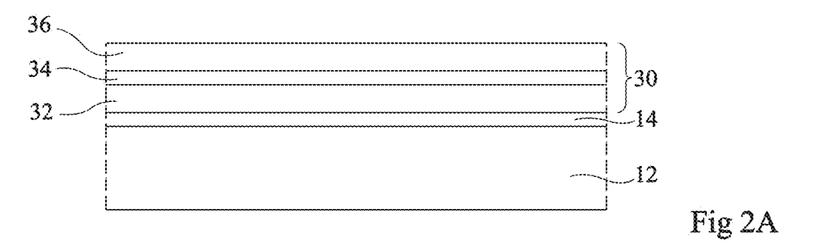
FIGS. 2A to 2C, previously described, are partial simplified cross-section views of structures obtained at successive steps of an example of a method of manufacturing the optoelectronic device of FIG. 1.
Figure 2B:
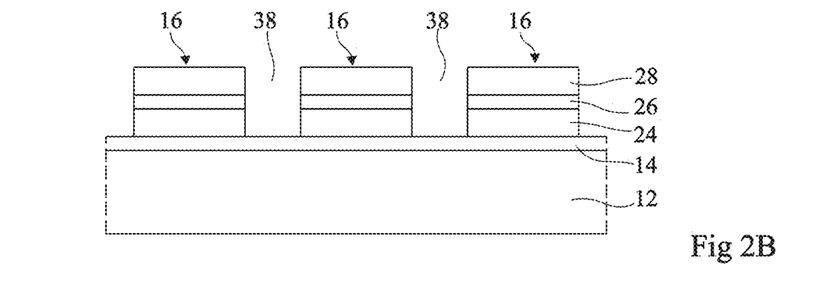
Figure 2C:
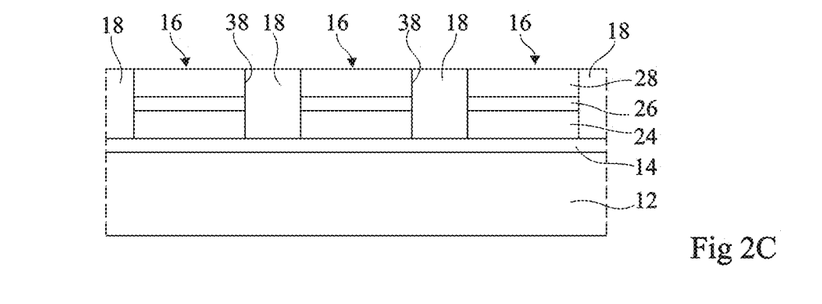

FIGS. 2A to 2C show the structures obtained at successive steps of an example of a method of manufacturing optoelectronic device 10.

FIG. 2A shows the structure obtained after having formed lower electrodes 14 on support 12 and after having deposited over the entire structure a stack 30 of successive semiconductor layers 32, 34, 36.

FIG. 2B shows the structure obtained after having etched openings 38 in stack 30 to delimit semiconductor portions 24, 26, 28 for each light-emitting diode 16.

FIG. 2C shows the structures obtained after having formed insulating portions 18 in openings 38 between light-emitting diodes 16. This may be performed by depositing an insulating layer over the entire structure shown in FIG. 2B, the insulating layer covering light-emitting diodes 16 and filling openings 38 and by etching the insulating layer all the way to portions 28 of light-emitting diodes 16.

The maximum light intensity capable of being emitted by each display sub-pixel P depends on the surface area occupied by light-emitting diode 16 as compared with the surface area of display sub-pixel P and cannot be greater than the total surface area of the display sub-pixel. The minimum distance between two adjacent light-emitting diodes 16 is imposed by the method of etching layers 32, 34, 36 and the method of forming insulating portions 18 and is generally greater than 3 µm, or even than 5 µm. This decreases the maximum surface area which can be occupied by each light-emitting diode 16.

Lower electrodes 14 may be formed by a continuous electrode layer. However, electrode layer 14 has the disadvantages of being resistive and of conducting light. The resistivity of lower electrode layer 14 strongly limits the maximum size of the optoelectronic device since the voltage drop between the edge and the center can rapidly exceed the correction capacities of the electronic control system. The conduction of light results in re-injecting part of the light emitted by a sub-pixel into the neighboring sub-pixels, strongly limiting the contrast and the saturation of the colors of the optoelectronic device. When lower electrodes 14 are formed by distinct strips, the distance necessary between sub-pixels is even greater.

Another disadvantage of the previously-described manufacturing method is that the steps of etching layers 32, 34, 36 may cause a deterioration of the lateral sides of active area 26 of each light-emitting diode 16 and disturb the light radiation emitted by active area 26 so that it is difficult to form sub-pixels having dimensions smaller than 15 μm by 15 μm and of good quality.

SUMMARY

An object of an embodiment is to overcome all or part of the disadvantages of previously—described optoelectronic devices comprising inorganic light-emitting diodes, particularly display screens or projection devices.

Another object of an embodiment is to increase the maximum light intensity that can be provided by each display sub-pixel.

Another object of an embodiment is for the light-emitting diode manufacturing method to comprise no step of etching the active layers of the light-emitting diodes.

Thus, an embodiment provides an optoelectronic device comprising a substrate comprising first and second opposite surfaces, lateral electric insulation elements extending from the first surface to the second surface and delimiting in the support first semiconductor or conductive portions electrically insulated from one another, the optoelectronic device further comprising, for each first portion, a first conductive pad on the second surface in contact with the first portion and a light-emitting diode or an assembly of light-emitting diodes resting on the first surface and electrically connected to the first portion, the optoelectronic device further comprising a conductive and at least partially transparent electrode layer covering all the light-emitting diodes, an insulating and at least partially transparent encapsulation layer covering the electrode layer, and at least one second conductive pad electrically connected to the electrode layer.

According to an embodiment, each light-emitting diode comprises at least one wire-shaped, conical, or tapered semiconductor element integrating or covered at the top and/or at least on a portion of its lateral surfaces with a shell comprising at least one active layer capable of supplying most of the radiation of the light-emitting diode.

According to an embodiment, the optoelectronic device further comprises a conductive layer covering the electrode layer around the light-emitting diodes of each assembly.

According to an embodiment, the lateral electric insulation elements comprise at least one insulating wall extending in the substrate from the first surface to the second surface.

According to an embodiment, the lateral electric insulation elements further delimit, in the support, a second semiconductor or conductive portion electrically insulated from the first semiconductor or conductive portions and electrically connected to the electrode layer.

According to an embodiment, the second conductive pad is in electric contact with the second semiconductor or conductive portion on the side of the second surface.

According to an embodiment, the second conductive pad is located on the side of the first surface.

According to an embodiment, the substrate is made of silicon, of germanium, of silicon carbide, of a III-V compound, such as GaN or GaAs, or of ZnO.

According to an embodiment, the substrate is made of single-crystal silicon and comprises a dopant concentration in the range from $5*10^{16}$ atoms/cm$^3$ to $2*10^{20}$ atoms/cm$^3$.

According to an embodiment, each semiconductor element is mainly made of a III-V compound, particularly gallium nitride, or of a II-VI compound.

According to an embodiment, the optoelectronic device comprises lenses on the encapsulation layer.

According to an embodiment, the optoelectronic device is a display screen or a projection device.

An embodiment also aims at a method of manufacturing an optoelectronic device comprising the steps of:

a) forming, in a substrate comprising first and second opposite surfaces, lateral electric insulation elements extending from the first surface to the second surface and delimiting in the support first semiconductor or conductive portions electrically insulated from one another and forming, for each first portion, a first conductive pad on the second surface in contact with the first portion;

b) forming, for each first portion, a light-emitting diode or an assembly of light-emitting diodes resting on the first surface and electrically connected to the first portion; and c) forming, for each first portion, a conductive and at least partially transparent electrode layer covering all the light-emitting diodes, an encapsulation layer made of an at least partially transparent dielectric material covering the electrode layer, and at least one second conductive pad electrically connected to the electrode layer.

According to an embodiment, step a) comprises the steps of:

before step b), forming, in the substrate, lateral electric insulation elements extending from the first surface down to part of the substrate depth; and after step c), thinning the substrate to form the second surface and expose the lateral electric insulation elements on the second surface.

According to an embodiment, the method further comprises depositing phosphors on at least some of the light-emitting diodes, particularly by photolithography techniques or by printing.

According to an embodiment, each light-emitting diode comprises at least one wire-shaped, conical, or tapered semiconductor element integrating or covered at the top and/or at least on a portion of its lateral surfaces with a shell comprising at least one active layer capable of supplying most of the radiation of the light-emitting diode.

BRIEF DESCRIPTION OF THE DRAWINGS

The foregoing and other features and advantages will be discussed in detail in the following non-limiting description of dedicated embodiments in connection with the accompanying drawings, among which.

DETAILED DESCRIPTION

For clarity, the same elements have been designated with the same reference numerals in the various drawings and, further, the various drawings are not to scale. Further, only those elements which are useful to the understanding of the described embodiments have been shown and are described. In particular, the device for controlling an optoelectronic device comprising light-emitting diodes is known by those skilled in the art and is not described hereafter. In the following description, unless otherwise specified, terms "substantially", "approximately", and "in the order of" mean "to within 10%".

The embodiments described hereafter relate to optoelectronic devices, particularly display screens or projection devices, comprising light-emitting diodes formed from three-dimensional semiconductor elements, for example, microwires, nanowires, conical elements, or tapered elements. In the following description, embodiments are described for light-emitting diodes formed from microwires or nanowires. However, such embodiments may be implemented for three-dimensional elements other than microwires or nanowires, for example, pyramid-shaped three-dimensional elements.

Further, in the following description, embodiments are described for light-emitting diodes each comprising a shell which at least partially surrounds the microwire or the nanowire. However, these embodiments may be implemented for light-emitting diodes for which the active area is located along the height or at the top of the microwire or of the nanowire.

Term "microwire" or "nanowire" designates a three-dimensional structure having a shape elongated according to a preferred direction, having at least two dimensions, called minor dimensions, in the range from 5 nm to 2.5 µm, preferably from 50 nm to 2.5 µm, the third dimension, called major dimension, being at least equal to 1 time, preferably at least 5 times, and more preferably still at least 10 times, the largest dimension of the minor dimensions. In certain embodiments, the minor dimensions may be smaller than or equal to approximately 1 µm, preferably in the range from 100 nm to 1 µm, more preferably from 100 nm to 300 nm. In certain embodiments, the height of each microwire or nanowire may be greater than or equal to 500 nm, preferably in the range from 1 µm to 50 µm.

In the following description, term "wire" is used to mean "microwire" or "nanowire". Preferably, the center line of the wire running through the centroid of the cross-sections, in planes perpendicular to the main direction of the wire, is substantially rectilinear and is called "axis" of the wire hereafter.

According to an embodiment, an optoelectronic device is provided, particularly a display screen or a projection device, which comprises an integrated circuit comprising a substrate, for example, a conductive or semiconductor substrate, divided into substrate portions electrically insulated from one another and comprising, for each display sub-pixel, assemblies of light-emitting diodes formed on the front surface of the substrate. Each assembly of light-emitting diodes comprises a light-emitting diode or a plurality of light-emitting diodes assembled in parallel. Parallel connection of light-emitting diodes means that the anodes of the light-emitting diodes are connected to one another and that the cathodes of the light-emitting diodes are connected to one another. Each assembly of elementary light-emitting diodes is equivalent to a general light-emitting diode comprising an anode and a cathode.

Figure 3A:
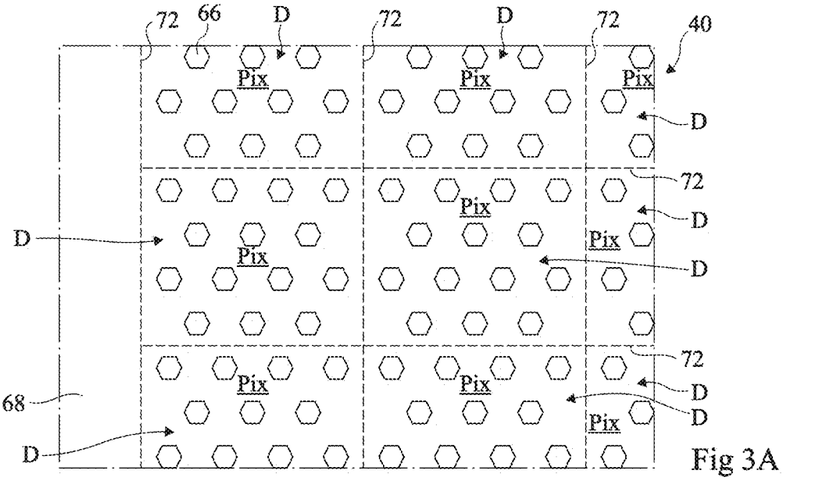
FIGS. 3A, 3B, and 3C are respectively a top view, a front cross-section view, and a bottom view, partial and simplified, of an embodiment of an optoelectronic device comprising light-emitting diodes.
Figure 3B:
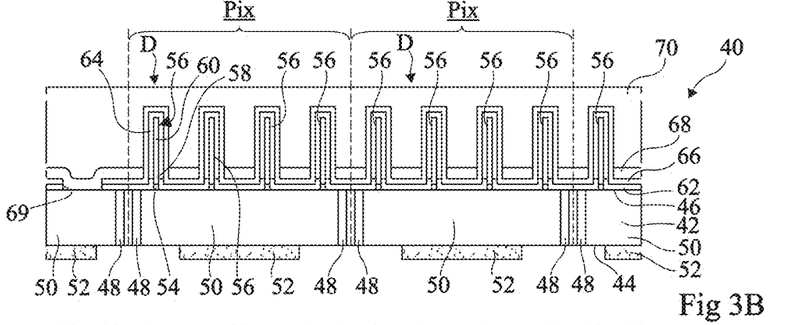
Figure 3C:
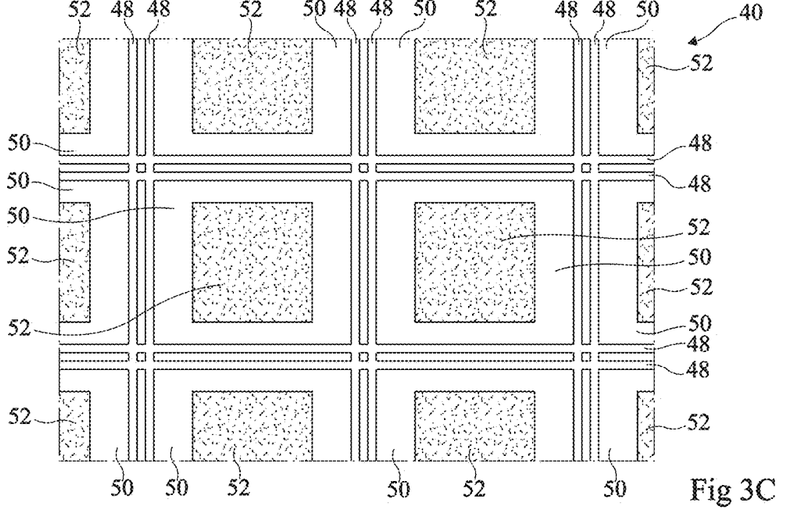

FIGS. 3A to 3C show an embodiment of an optoelectronic device 40, particularly a display screen and a projection device, comprising:
  a conductive or semiconductor substrate 42 comprising a lower surface 44 and an opposite upper surface 46, upper surface 46 being preferably planar at least at the level of the assemblies of light-emitting diodes;
  electric insulation elements 48 which extend in substrate 42 between surfaces 44 and 46 and which divide substrate 42 into conductive or semiconductor portions 50;
  conductive pads 52 in contact with lower surface 44, each portion 50 being in contact with one of conductive pads 52;
  seed pads 54 favoring the growth of wires, each seed pad 54 being in contact with surface 46 on one of conductive or semiconductor portions 50;
  wires 56, each wire 56 being in contact with one of seed pads 54, each wire 56 comprising a lower portion 58, in contact with seed pad 54 and an upper portion 60, continuing lower portion 58;
  an insulating layer 62 extending on surface 46 of substrate 42 and extending on the lateral sides of lower portion 58 of each wire 56;
  a shell 64 comprising a stack of semiconductor layers covering upper portion 60 of each wire 56;
  a conductive and at least partially transparent layer 66 forming an electrode covering each shell 64, and extending on insulating layer 62 between wires 56;
  a conductive layer 68 covering electrode layer 66 between wires 56 but which does not extend on wires 56, conductive layer 68 being further in contact with one of semiconductor portions 50 through an opening 69 provided in electrode layer 66 and in insulating layer 62; and
  a transparent encapsulation layer 70 covering the entire structure.

Optoelectronic device 40 may further comprise a phosphor layer, not shown, and/or colored filters, not shown, inside of encapsulation layer 70 or on top of encapsulation layer 70. According to an embodiment, phosphors are in particular distributed between wires 56.

Each wire 56 and the associated shell 64 form an elementary light-emitting diode. The elementary light-emitting diodes located on a same semiconductor portion 50 form an assembly D of light-emitting diodes. Each assembly D thus comprises a plurality of elementary light-emitting diodes connected in parallel. The number of elementary light-emitting diodes per assembly D may vary from 1 to several thousands, typically from 25 to 100. The number of elementary light-emitting diodes per assembly D may vary from one assembly to the other.

Each display sub-pixel Pix of optoelectronic device 40 comprises one of conductive or semiconductor portions 50 and assembly D of light-emitting diodes resting on portion 50. In FIG. 3A, the separation between display sub-pixels Pix has been schematically shown in dotted lines 72. According to an embodiment, the surface area occupied by each sub-pixel Pix in top view may vary from 3 µm by 3 µm to several $mm^2$ and typically from 10 to 100 $µm^2$.

Each elementary light-emitting diode is formed of a shell at least partially covering a wire. The developed surface area of the elementary light-emitting diodes of an assembly D is greater than the surface area of the display sub-pixel comprising assembly D. The maximum light intensity capable of being supplied by the display sub-pixel may thus be greater than that of a display sub-pixel formed with a two-dimensional inorganic light-emitting diode technology.

According to an embodiment, substrate 42 corresponds to a monolithic semiconductor substrate. Semiconductor substrate 42 is, for example, a substrate made of silicon, of germanium, or of a III-V compound such as GaAs. Preferably, substrate 42 is a single-crystal silicon substrate.

Preferably, semiconductor substrate 42 is doped to lower the electric resistivity down to a resistivity close to that of metals, preferably smaller than a few mohms·cm. Substrate 42 is, preferably, a heavily-doped semiconductor substrate with a dopant concentration in the range from $5*10^{16}$ atoms/cm$^3$ to $2*10^{20}$ atoms/cm$^3$, preferably from $1*10^{19}$ atoms/cm$^3$ to $2*10^{20}$ atoms/cm$^3$, for example, $5*10^{19}$ atoms/cm$^3$. At the beginning of the optoelectronic device manufacturing method, substrate 42 has a thickness in the range from 275 µm to 1,500 µm, preferably 725 µm. Once the optoelectronic device has been formed, after a thinning step described in further detail hereafter, substrate 42 has a thickness in the range from 1 µm to 100 µm. In the case of a silicon substrate 42, examples of P-type dopants are boron (B) or indium (In) and examples of N-type dopants are phosphorus (P), arsenic (As), or antimony (Sb). Preferably, substrate 42 is N-type phosphorus doped. Surface 44 of silicon substrate 42 may be a (100) surface.

Seed pads 54, also called seed islands, are made of a material favoring the growth of wires 56. A treatment may be provided to protect the lateral sides of the seed pads and the surface of the substrate portions which are not covered with the seed pads to prevent the growth of wires on the lateral sides of the seed pads and on the surface of the substrate portions which are not covered with the seed pads. The treatment may comprise the forming of a dielectric region on the lateral sides of the seed pads and extending on top of and/or inside of the substrate and connecting, for each pair of pads, one of the pads in the pair to the other pad in the pair, without for the wires to grow on the dielectric region. Said dielectric region may extend above seed pads 54. As a variation, seed pads 54 may be replaced with a seed layer covering surface 46 of substrate 42. A dielectric region may then be formed above the seed layer to prevent the growth of wires in unwanted locations.

As an example, the material forming seed pads 54 may be a transition metal from column IV, V, VI of the periodic table of elements or a nitride, a carbide, or a boride of a transition metal from column IV, V, or VI of the periodic table of elements or a combination of these compounds.

As an example, seed pads 54 may be made of aluminum nitride (AlN), of boron (B), of boron nitride (BN), of titanium (Ti), or titanium nitride (TiN), of tantalum (Ta), of tantalum nitride (TaN), of hafnium (Hf), of hafnium nitride (HfN), of niobium (Nb), of niobium nitride (NbN), of zirconium (Zr), of zirconium borate (ZrB$_2$), of zirconium nitride (ZrN), of silicon carbide (SiC), of tantalum nitride and carbide (TaCN), of magnesium nitride in Mg$_x$N$_y$ form, where x is approximately equal to 3 and y is approximately equal to 2, for example, magnesium nitride in Mg$_3$N$_2$ form or magnesium gallium nitride (MgGaN), of tungsten (W), of tungsten nitride (WN), or of a combination thereof.

Insulating layer 62 may be made of a dielectric material, for example, of silicon oxide (SiO$_2$), of silicon nitride (Si$_x$N$_y$, where x is approximately equal to 3 and y is approximately equal to 4, for example, Si$_3$N$_4$), of silicon oxynitride (SiO$_x$N$_y$, where x may be approximately equal to ½ and y may be approximately equal to 1, for example, Si$_2$ON$_2$), of aluminum oxide (Al$_2$O), of hafnium oxide (HfO$_2$), or of diamond. As an example, the thickness of insulating layer 62 is in the range from 5 nm to 800 nm, for example, equal to approximately 30 nm.

Wires 56 are at least partly made of at least one semiconductor material. The semiconductor material may be silicon, germanium, silicon carbide, a III-V compound, a II-VI compound, or a combination of these compounds.

Wires 56 may be at least partly made of semiconductor materials mainly comprising a III-V compound, for example, III-N compounds. Examples of group-III elements comprise gallium (Ga), indium (In), or aluminum (Al). Examples of III-N compounds are GaN, AlN, InN, InGaN, AlGaN, or AlInGaN. Other group-V elements may also be used, for example, phosphorus or arsenic. Generally, the elements in the III-V compound may be combined with different molar fractions.

Wires 56 may be at least partly made of semiconductor materials mainly comprising a II-VI compound. Examples of group-II elements comprise group-IIA element, particularly beryllium (Be) and magnesium (Mg) and group-IIB elements, particularly zinc (Zn) and cadmium (Cd). Examples of group-VI elements comprise group-VIA elements, particularly oxygen (O) and tellurium (Te). Examples of II-VI compounds are ZnO, ZnMgO, CdZnO, or CdZnMgO. Generally, the elements in the II-VI compound may be combined with different molar fractions.

Wires 56 may comprise a dopant. As an example, for III-V compounds, the dopant may be selected from the group comprising a P-type group-II dopant, for example, magnesium (Mg), zinc (Zn), cadmium (Cd), or mercury (Hg), a P-type group-IV dopant, for example, carbon (C) or an N-type group-IV dopant, for example, silicon (Si), germanium (Ge), selenium (Se), sulfur (S), terbium (Tb), or tin (Sn).

The cross-section of wires 56 may have different shapes, such as, for example, an oval, circular, or polygonal shape, particularly triangular, rectangular, square, or hexagonal. As an example, in FIG. 3A, the wires are shown with a hexagonal cross-section. It should thus be understood that term "diameter" or "average diameter" in a cross-section of a wire or of a layer deposited on this wire designates a quantity associated with the surface of the targeted structure in this cross-section, for example corresponding to the diameter of the disk having the same surface area as the cross-section of the wire. The average diameter of each wire 56 may be in the range from 50 nm to 5 µm. The height of each wire 56 may be in the range from 250 nm to 50 µm. Each wire 56 may have a semiconductor structure elongated along an axis substantially perpendicular to surface 46. Each wire 56 may have a generally cylindrical shape. The axes of two adjacent wires 56 may be distant by from 0.5 µm to 10 µm and preferably from 1.5 µm to 5 µm. As an example, wires 56 may be regularly distributed, particularly according to a hexagonal network.

As an example, lower portion 58 of each wire 56 is mainly made of the 111-N compound, for example, doped gallium nitride of the same type as substrate 42, for example, of type N, for example, silicon-doped. Lower portion 58 extends along a height which may be in the range from 100 nm to 25 µm.

As an example, upper portion 60 of each wire 56 is at least partially made of a III-N compound, for example, GaN. Upper portion 60 may be N-type doped, possibly less heavily doped than lower portion 58, or may not be intentionally doped. Upper portion 60 extends along a height which may be in the range from 100 nm to 25 µm.

Shell 64 may comprise a stack of a plurality of layers especially comprising:

an active layer covering upper portion 60 of the associated wire 56;

an intermediate layer having a conductivity type opposite to that of lower portion 58 and covering the active layer, and a connection layer covering the intermediate layer and covered with electrode 66.

The active layer is the layer from which most of the radiation supplied by the elementary light-emitting diode is emitted. According to an example, the active layer may comprise means for confining the electric charge carriers, such as multiple quantum wells. It is for example formed of an alternation of GaN and InGaN layers having respective thicknesses from 5 to 20 nm (for example, 8 nm) and from 1 to 15 nm (for example, 2.5 nm). The GaN layers may be doped, for example, of type N or P. According to another example, the active layer may comprise a single InGaN layer, for example having a thickness greater than 10 nm.

The intermediate layer, for example, P-type doped, may correspond to a semiconductor layer or to a stack of semiconductor layers and enables to form a P-N or P-I-N junction, the active layer being located between the intermediate P-type layer and upper N-type portion 60 of the P-N or P-I-N junction.

The bonding layer may correspond to a semiconductor layer or to a stack of semiconductor layers and enables to form an ohmic contact between the intermediate layer and electrode 66. As an example, the bonding layer may be very heavily doped with the type opposite to that of lower portion 58 of each wire 56, until it degenerates the semiconductor layers, for example, P-type doped with a concentration greater than or equal to $10^{20}$ atoms/cm$^3$.

The stack of semiconductor layers may comprise an electron barrier layer formed of a ternary alloy, for example, of aluminum gallium nitride (AlGaN) or of aluminum indium nitride (AlInN) in contact with the active layer and the intermediate layer, to ensure a good distribution of electric carriers in the active layer.

Electrode 66 is capable of biasing the active layer of each wire 56 and of letting through the electromagnetic radiation emitted by the light-emitting diodes. The material forming electrode 66 may be a transparent conductive material such as indium tin oxide (or ITO), aluminum zinc oxide, gallium zinc oxide or indium zinc oxide, or graphene. As an example, electrode layer 66 has a thickness in the range from 5 nm to 200 nm, preferably from 20 nm to 50 nm.

Conductive layer 68 preferably corresponds to a metal layer, for example, made of aluminum, of copper, of gold, of ruthenium, or of silver, or to a stack of metal layers, for example, made of titanium-aluminum, of silicon-aluminum, of titanium-nickel-silver, of copper, or of zinc. As an example, conductive layer 68 has a thickness in the range from 20 nm to 1,500 nm, preferably from 400 nm to 800 nm. Conductive layer 68 is only present between the wires and does not cover the emissive surface thereof. Conductive layer 68 enables to decrease resistive losses during the flowing of current. It also has a reflector function to reflect to the outside the rays emitted by the light-emitting diodes towards the substrate.

Encapsulation layer 70 is made of an at least partially transparent insulating material. The minimum thickness of encapsulation layer 70 is in the range from 250 nm to 50 µm so that encapsulation layer 70 totally covers electrode 66 at the top of light-emitting diodes assemblies D. Encapsulation layer 70 may be made of an at least partially transparent inorganic material. As an example, the inorganic material is selected from the group comprising silicon oxides of $SiO_x$, where x is a real number between 1 and 2 or $SiO_yN_z$, where y and z are real numbers between 0 and 1, and aluminum oxides, for example, $Al_2O_3$. Encapsulation layer 70 may be made of an at least partially transparent organic material. As an example, encapsulation layer 70 is a silicone polymer, an epoxide polymer, an acrylic polymer, or a polycarbonate.

Electric insulation elements 48 may comprise trenches extending across the entire thickness of substrate 42 and filled with an insulating material, for example, an oxide, particularly silicon oxide, or an insulating polymer. As a variation, the walls of each trench 48 are covered with an insulating layer, the rest of the trench being filled with a semiconductor or conductive material, for example, polysilicon. According to another variation, electric insulation elements 48 comprise doped regions of a polarity type opposite to that of substrate 42 and extending along the entire depth of substrate 42. As an example, each trench 48 has a width greater than 1 µm, which particularly varies from 1 µm to 10 µm, for example, approximately 2 µm. The distance between the two trenches 48 of a pair of adjacent trenches 48 is greater than 5 µm, for example, approximately 6 µm. In FIGS. 3B and 3C, electric insulation elements 48 comprise pairs of adjacent trenches 48 which delimit portions 50 of substrate 42. As an example, a single trench 48 may be provided to electrically insulate each portion 50.

Generally, trenches as thin as this can only be formed with a limited depth, between some ten micrometers and some hundred micrometers according to the selected etching and insulation technique. Substrate 42 should thus be thinned until electric insulation elements 48 are exposed.

To achieve this, a handle made of a rigid material may be temporarily or definitively bonded to encapsulation layer 70. In the case where the handle is definitively bonded to encapsulation layer 70, the handle is made of an at least partially transparent material. It may be glass, particularly a borosilicate glass, for example, the glass known as Pyrex. or sapphire. After thinning, rear surface 44 of the substrate may be treated, and then, if the bonding is temporary, the handle may be separated.

Each conductive pad 52 may correspond to a layer or to a stack of layers covering surface 44. As a variation, an insulating layer may partially cover surface 44, each conductive pad 52 being in contact with the associated semiconductor portion 50 through openings etched in this insulating layer.

In the present embodiment, optoelectronic device 40 is bonded to another circuit by fusible conductive elements, not shown, for example, solder bumps or indium bumps bonded to conductive pads 52. The assembly of optoelectronic device 40 on another circuit, particularly on a control circuit, is performed by means of conventional matrix hybridization techniques, by means of fusible bumps, for example, made of indium, or of SnAg, or of copper columns, or of gold pads (stud bump technology) or by conductive molecular bonding (copper on copper). The metal stack forming conductive pads 52 is selected to be compatible with the selected assembly technology. As an example, conductive pads 52 may be made of Cu or Ti—Ni—Au, Sn—Ag or Ni—Pd—Au.

The active layer of shell 64 of the elementary light-emitting diodes of at least one of the assemblies of light-emitting diodes D may be manufactured differently from the active layer of the shell of the elementary light-emitting diodes of at least another assembly of light-emitting diodes. For example, the active layer of shell 64 of a first assembly may be capable of emitting light at a first wavelength, for example, blue light and the active layer of shell 64 of a second assembly may be capable of emitting light at a second wavelength different from the first wavelength, for example, green light. This may be obtained, for example by adapting in each assembly the pitch and the size of the wires, which results in modifying the thickness and the composition of the quantum wells forming these active layers.

Further, a third assembly may be adapted to emit light at a third wavelength different from the first and second wavelengths, for example, red light. Thus, the composition of the blue, green, and red lights may be selected so that an observer perceives white light by color composition, each diode, or diode assembly, emitting at a first, second, and third wavelength capable of being addressed independently from the others to adjust the color.

According to another embodiment, a phosphor is arranged between and on top of light-emitting diodes of a sub-pixel. The phosphor may absorb the deep blue light emitted by the light-emitting diodes and transform it into green or red, or even into blue. The advantage of using a blue phosphor rather than the natural emission of the light-emitting diodes is an insensitivity of the quality of the blue to color variations of the spontaneous emission of the wires, from one batch to the other, or within a same substrate.

A method of selective phosphor deposition comprises mixing the phosphor grains of a first color with silicon resist, and then, after spreading over the entire substrate and the light emitting diodes, bonding the phosphors to the desired sub-pixels by photolithography. The operation is repeated with a second phosphor and as many times as there are sub-pixels of different colors.

Another method is to use inkjet-type printing equipment with an "ink" made of the silicone-phosphor mixture and of specific additives. By printing, based on a mapping and on the orientation and of a referencing of the sub-pixels, the phosphors are deposited at the required locations.

Lenses may be provided on encapsulation layer 70. As an example, one lens may be provided for each sub-pixel or for sub-pixel assemblies.

In the previously-described embodiment, insulating layer 62 covers the entire contour of lower portion 58 of each wire 56. As a variation, it is possible for part of lower portion 58, or even for the entire lower portion 58, not to be covered with insulating layer 62. In this case, shell 64 may cover each wire 56 up to a height greater than the height of upper portion 60, or even along the entire height of wire 56. Further, in the previously-described embodiment, insulating layer 62 does not cover the contour of upper portion 60 of each wire 56. As a variation, insulating layer 62 may cover part of upper portion 60 of each wire 56. Further, according to another variation, insulating layer 62 may, for each wire 56, partially cover the lower portion of shell 64. According to another embodiment, layer 62 may be absent, particularly in the case where seed pads 54 are replaced with a seed layer covered with a dielectric layer and the wires are formed on the seed layer in openings provided in the dielectric layer.

Optoelectronic device 40 may be placed on another integrated circuit, particularly, a control circuit, comprising electronic components, particularly transistors, used to control the light-emitting diode assemblies of optoelectronic device 40.

In operation, conductive pads 52 electrically connected to conductive layer 68 may be connected to a source of a first reference potential. Conductive pad 52 in contact with portion 50 of substrate 42 having the elementary light-emitting diodes of a light-emitting diode assembly D to be activated resting thereon may be connected to a source of a second reference potential to circulate a current through the elementary light-emitting diodes of the considered assembly D. Since each conductive pad 52 can extend over a significant part of the associated portion 50, a homogeneous distribution of the current can be obtained.

In FIGS. 3A to 3C, conductive layer 68 is shown in contact with portions 50 along a side of optoelectronic device 40. As a variation, conductive layer 68 may be in contact with portion 50 along the entire contour of optoelectronic device 40.

According to an embodiment, optoelectronic device 40 is at least partly formed according to the method described in patent application FR 13/59413 which is herein incorporated by reference.

An embodiment of a method of manufacturing optoelectronic device 40 may comprise the steps of:

(1) Etching, for each electric insulation element 48, an opening in substrate 42 on the side of front surface 46. The opening may be formed by an etching of reactive ion etching type, for example, a DRIE etching. The depth of the opening is greater than the targeted thickness of substrate 42 after a thinning step described hereafter. As an example, the depth of the opening is in the range from 10 μm to 200 μm, for example approximately 35 μm or 60 μm.

(2) Forming an insulating layer, for example, made of silicon oxide, on the lateral walls of the opening, for example, by a thermal oxidation method. The thickness of the insulating layer may be in the range from 100 nm to 3,000 nm, for example, approximately 200 nm.

(3) Filling the opening with a filling material, for example, polysilicon, tungsten, or a refractory metallic material compatible with the steps of the manufacturing method carried out at high temperatures, for example deposited by low pressure chemical vapor deposition (LPCVD). Polysilicon advantageously has a thermal expansion coefficient close to that of silicon and thus enables to decrease the mechanical stress during the steps of the manufacturing method carried out at high temperatures.

(4) Chem.-mech. polishing (CMP) to expose the silicon surface and remove any relief.

(5) Forming seed portions 54, wires 56, insulating layer 62, and shells 64, by epitaxial growth, as described in patent applications WO2014/044960 and FR 13/59413, which are incorporated herein by reference.

(6) Forming electrode 66 over the entire structure, for example by conformal chemical vapor deposition (CVD), particularly atomic layer deposition (ALD), or physical vapor deposition (PVD).

(7) Forming opening 69 through insulating layer 62 and electrode layer 66.

(8) Forming conductive layer 68 for example by PVD over the entire structure obtained at step (7) and etching this layer to expose the portion of electrode layer 66 covering each wire 56.

(9) Thermally treating by anneal the contacts following the stacking of layer 68.

(10) Depositing encapsulation layer 70 over the entire structure obtained at step (8).

(11) Thinning substrate 42 all the way to lateral insulation elements 48.

(12) Forming conductive pads 52.

The active area of each elementary light-emitting diode is formed by epitaxial growth steps on a portion of wire 56. The method of manufacturing optoelectronic device 40 thus comprises no etch steps which might deteriorate the active areas of the light-emitting diodes.

Advantageously, the delimitation of display sub-pixels Pix is performed by electric insulation elements 48 only and causes no modifications of the elementary light-emitting diode manufacturing steps. According to an embodiment, the elementary light-emitting diodes may be uniformly distributed on surface 46 of substrate 42. Even though elementary light-emitting diodes may be vertically in line with electric insulation elements 48 and not be functional, this has the advantage that the elementary light-emitting diode manufacturing steps are identical whatever the shape of the display sub-pixels.

In the embodiments shown in FIGS. 3A to 3C, optoelectronic device 40 is electrically connected to an external circuit by solder bumps provided on the side of lower surface 44 of substrate 42. However, other electric connection modes may be envisaged.

In the previously-described embodiments, substrate 42 is made of a semiconductor or conductive material. According to another embodiment, substrate 42 is totally or partly made of an insulating material, for example, of silicon dioxide (SiO$_2$) or of sapphire. The electric connection between conductive pads 52 and conductive layer 68 or seed pads 54 may be formed by using conductive elements crossing substrate 42 across its entire thickness, for example, through silicon vias or TSVs.

Figure 4A:
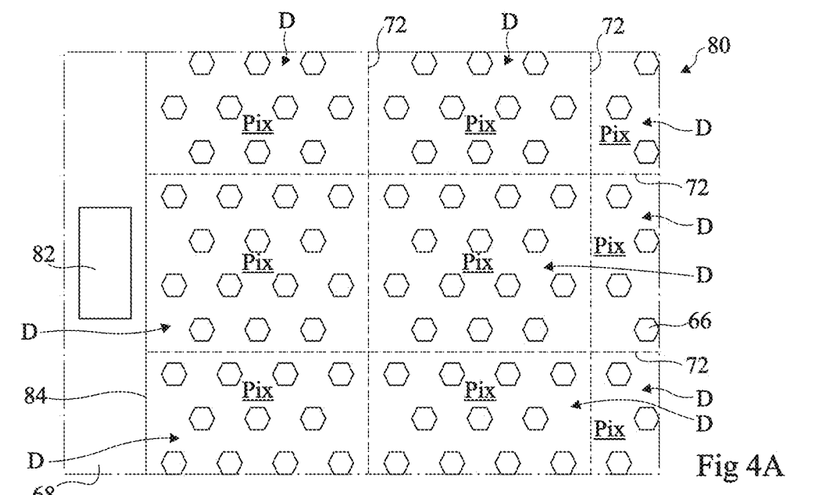
FIGS. 4A to 4C are respectively a top view, a front cross-section view, and a bottom view, partial and simplified, of another embodiment of an optoelectronic device comprising light-emitting diodes.
Figure 4B:
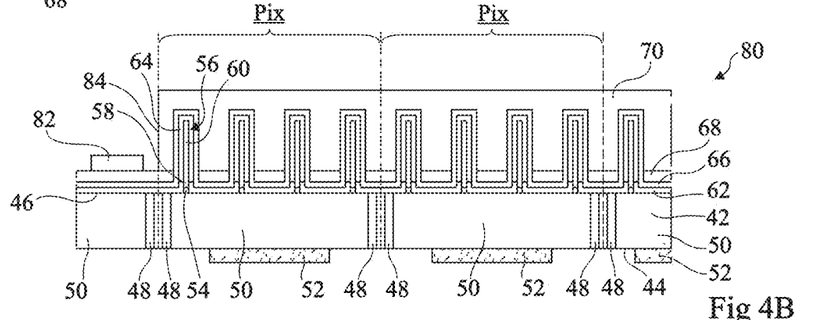
Figure 4C:
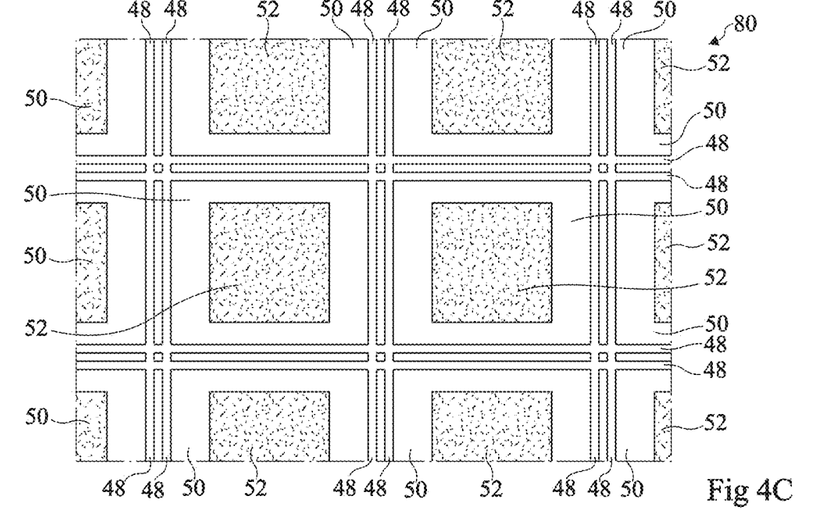

FIGS. 4A, 4B, and 4C are drawings respectively similar to FIGS. 3A, 3B, and 3C of another embodiment of an optoelectronic device 80, particularly a display screen or a projection device, where at least one conductive pad 82 is provided in contact with conductive layer 68 on the side of front surface 46. Encapsulation layer 70 then comprises an opening 84 which exposes conductive pad 82. Previously-described opening 69 is not present. Neither conductive layer 68 nor electrode layer 66 are in electric contact with semiconductor substrate 42. Further, there may be no conductive pad 52 in contact with portions 50 of semiconductor substrate 42 which is not electrically connected to elementary light-emitting diodes. Conductive pad 82 is electrically connected to an external circuit, not shown, by a wire not shown. A single conductive pad 82 is shown in FIG. 4A. As a variation, a plurality of conductive pads 82 may be distributed on conductive layer 68, for example, at the periphery of optoelectronic device 80.

Figure 5A:
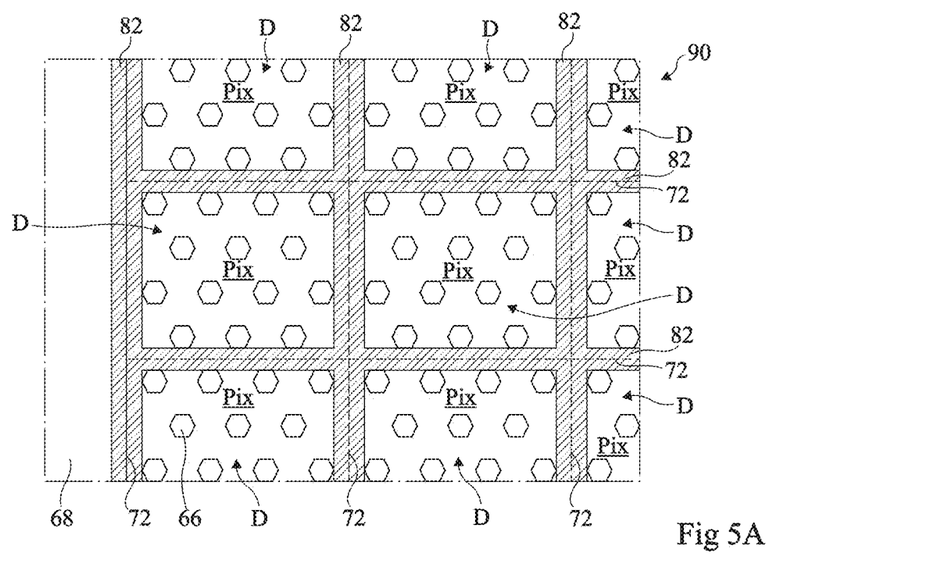
FIGS. 5A and 5B are respectively a top view and a front cross-section view, partial and simplified, of another embodiment of an optoelectronic device comprising light-emitting diodes.
Figure 5B:
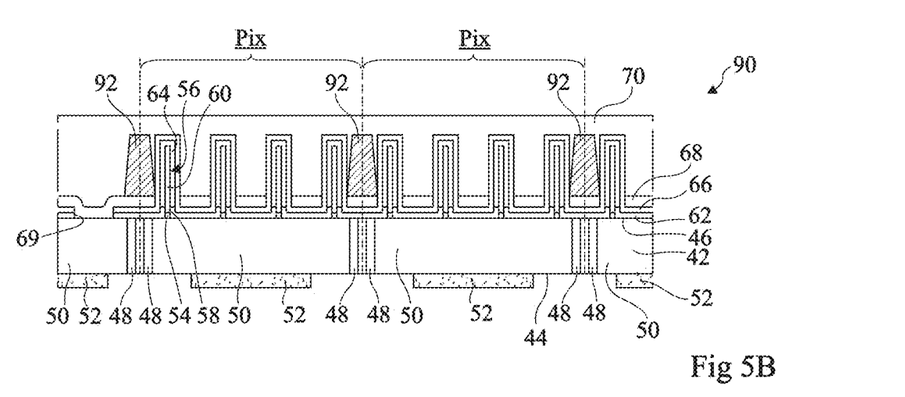

FIGS. 5A and 5B are drawings respectively similar to FIGS. 3A and 3B of another embodiment of an optoelectronic device 90, particularly a display screen or a projection device. Optoelectronic device 90 comprises all the elements of optoelectronic device 40 and further comprises opaque portions 92 resting on conductive layer 68 between adjacent display sub-pixels, that is, substantially continuing electric insulation elements 48.

The height of each opaque portion 92 may be greater than or equal to the height of wires 56. Preferably, the width of each opaque portion 92 is smaller than or equal to the smallest interval between two elementary light-emitting diodes of adjacent assemblies D. As an example, each opaque portion 82 may be made of a black-colored resin. This resin is preferably capable of absorbing an electromagnetic radiation over the entire visible spectrum. The presence of opaque portions 92 advantageously enables to increase the contrast of optoelectronic device 90.

Figure 6:
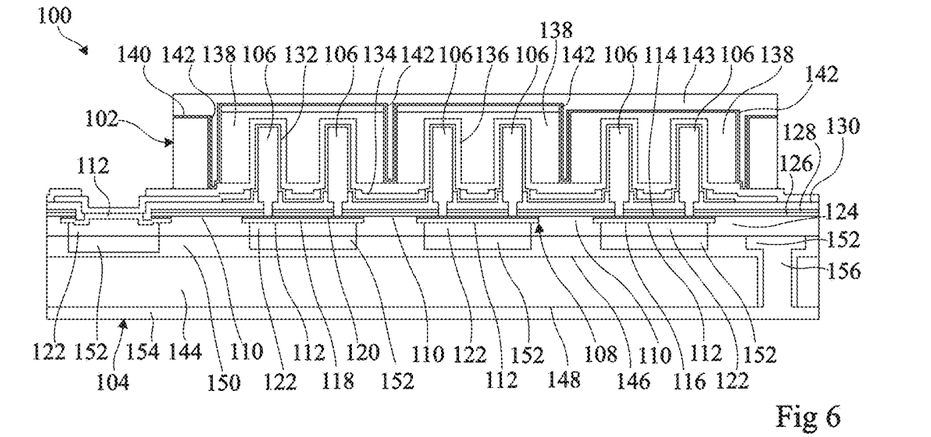
FIGS. 6 and 7 are partial simplified cross-section views of embodiments of an optoelectronic device comprising inorganic light-emitting diodes.

FIG. 6 is a partial simplified cross-section view of an embodiment of an optoelectronic device 100 comprising inorganic light-emitting diodes. FIG. 6 shows an embodiment of an optoelectronic device 100, for example a display pixel for a display screen or for an image projection device.

Optoelectronic device 100 comprises two integrated circuits 102, 104. First integrated circuit 102 comprises at least three light-emitting diodes 106 and is called optoelectronic circuit or optoelectronic chip in the following description. Second integrated circuit 104 comprises electronic components, not shown, especially transistors, used to control light-emitting diodes 106 of optoelectronic chip 102. Second integrated circuit 104 is called control circuit or control chip in the following description. Optoelectronic circuit 102 is bonded to control circuit 104. In an embodiment, optoelectronic chip 102 comprises a flat face and control chip 104 comprises a flat face, and the flat face of optoelectronic chip 102 is bonded to the flat face of control chip 104, the flat face of optoelectronic chip 102 being in direct contact with the flat face of control chip 104. Each flat face can comprise insulating areas and conductive areas. In this case, the bonding is a heterogeneous direct bonding.

In an embodiment, optoelectronic chip 102 comprises:
a substrate 108;
lateral electric insulation elements 110 crossing completely substrate 108 and delimiting portions 112 of substrate 108 electrically insulated from each other, four portions 112 being shown on FIG. 6, each substrate portion 112 having two opposite faces 114, 116, each substrate portion 112 comprising a stack of two conductive layers 118, 120, conductive layer 120 being on the side of face 114, conductive layer 120 covering completely layer 118 for all substrate portions 112 except at least one for which layer 120 only partially covers layer 118;
electrically conductive pads 122, each conductive pad 122 being in contact with one of substrate portions 112 on face 116;
an electrically insulating layer 124 located between conductive pads 122 and extending into insulation elements 110, electrically insulating layer 124 and insulation elements 110 forming a continuous medium in an embodiment;
a stack of electrically insulating layers covering faces 114 of substrate portions 112 and insulation elements 110, three insulating layers 126, 128, 130 being shown on FIG. 6;
light-emitting diodes 106 in contact with faces 114 of substrate portions 112 through insulating layers 126, 128, 130, on FIG. 6, three substrate portions 112 are each connected to two light-emitting diodes 106;
an electrically conductive layer 132, transparent to the radiation emitted by light-emitting diodes 106 and covering all light-emitting diodes 106;
an electrically conductive layer 134 covering conductive layer 132 around each light-emitting diode 106 and in contact with one of substrate portions 112 through insulating layers 126, 128, 130;
an electrically insulating layer 136, transparent to the radiation emitted by light-emitting diodes 106 and covering conductive layer 134 and conductive layer 132 on light-emitting diodes 106 and open to expose part of conductive layer 134 at the contact zone between conductive layer 134 and substrate portion 112;
photoluminescent blocks 138 resting on insulating layer 136 and facing light-emitting diodes 106, three photoluminescent blocks 138 being shown on FIG. 6, each photoluminescent block 138 being adapted to convert the radiation emitted by light-emitting diodes 106 into a desired radiation, photoluminescent blocks 138 being separate from each other;

an electrically insulating layer 140, transparent to the radiation emitted by photoluminescent blocks 138 and resting on photoluminescent blocks 138;

a reflective layer 142, resting on insulating layer 140, between each pair of photoluminescent blocks 138, reflective layer 142 being adapted to reflect the radiations emitted by photoluminescent blocks 138;

an electrically insulating layer 143 transparent to the radiation emitted by photoluminescent blocks 138 and covering the top of photoluminescent blocks 138.

Control circuit 104 comprises a substrate 144 having two opposite faces 146, 148. Face 146 is on the side of optoelectronic circuit 102. A stack of electrically insulating layers, not shown, in which are formed tracks of metallization levels can cover face 146. Electronic components, not shown, are made inside substrate 144 and on face 146. An electrically insulating layer 150 covers face 146. Electrically conductive pads 152 extend through insulating layer 150 and contact conductive pads 122. Conductive pads 152 link the electronic components of control circuit 104 to conductive pads 122. Control circuit 104 also comprises an electrically conductive layer 154 covering face 148. Control circuit 104 also comprises one or two conductive vias. For instance, a single via 156 can extend from face 146 to face 148 and electrically link conductive layer 154 to the electronic components formed on the side of face 146.

Figure 7:
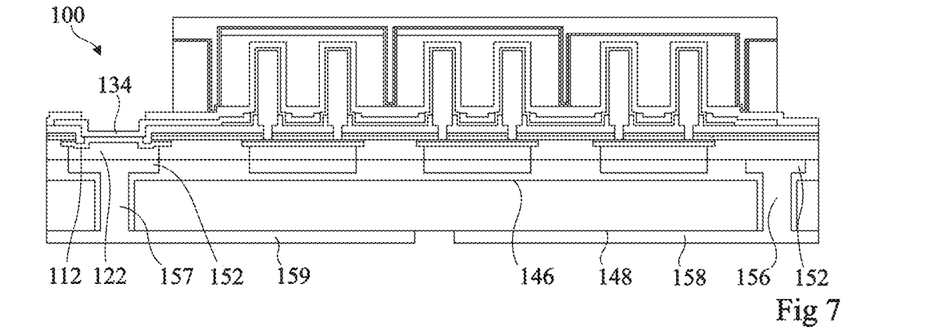

FIG. 7 shows a variation of optoelectronic device 100 in which two conductive vias 156, 157 extending from face 146 to face 148 in control chip 104 are shown and in which conductive layer 154 is replaced by two separated conductive pads 158, 159 on face 148. Conductive via 156 electrically links conductive pad 158 to the electronic components formed on the side of face 146 and conductive via 157 electrically links conductive pad 159 to conductive layer 134, through the conductive pads 122, 152 and the substrate portion 112 shown on the left side of FIG. 7. In this variation of optoelectronic device 100, both contacts of optoelectronic device 100 can be taken on the rear face of the device.

Each light-emitting diode 106 can have the structure of the previously disclosed elementary light-emitting diode comprising wire 56 and the associated shell 64. Conductive layer 120 can be made of the same materials previously disclosed for seed pads 54. The thickness of conductive layer 120 is inferior to 3 μm. Insulating layers 124, 126, 128, 130, 136, 140, 143 and insulation elements 110 can be made of the same materials previously disclosed for insulating layer 62. Insulating layer 130 can have a thickness between 10 nm and 10 μm, for example about 300 nm. Conductive layer 132 can be made of the same materials previously disclosed for electrode 66. Conductive layers 118, 134, 154, conductive pads 122, 152 and via 156 can be made of the same materials previously disclosed for conductive layer 68. Conductive layer 118 can have a thickness between 10 nm and 10 μm, for example about 500 nm.

Substrate 144 can correspond to a monolithic semiconductor substrate. Semiconductor substrate 144 is, for example, a substrate made of silicon, of germanium, or of a III-V compound such as GaAs. Preferably, substrate 144 is a single-crystal silicon substrate. The thickness of substrate 144, after the thinning step disclosed hereafter, ranges from 1 μm to 50 μm.

Photoluminescent block 138 may comprise a matrix having micrometer-range photoluminescent particles or nanometer-range monocrystalline particles of a semiconductor material, also called semiconductor nanocrystals, dispersed therein. According to an embodiment, the average size of the nanocrystals is in the range from 0.5 nm to 1,000 nm, preferably from 0.5 nm to 500 nm, more preferably from 1 nm to 100 nm, particularly from 2 nm to 30 nm. For dimensions smaller than 50 nm, the photoconversion properties of semiconductor nanocrystals essentially depend on quantum confinement phenomena. The semiconductor nanocrystals then correspond to quantum boxes or quantum dots.

According to an embodiment, the semiconductor material of the semiconductor crystals is selected from the group comprising cadmium selenide (CdSe), indium phosphide (InP), cadmium sulfide (CdS), zinc sulfide (ZnS), zinc selenide (ZnSe), cadmium telluride (CdTe), zinc telluride (ZnTe), cadmium oxide (CdO), zinc cadmium oxide (ZnCdO), cadmium zinc sulfide (CdZnS), cadmium zinc selenide (CdZnSe), silver indium sulfide ($AgInS_2$), indium gallium nitride (InGaN), perovskites, in particular in $CsBX_3$ form, where B can be lead (Pb) or tin (Sn) and X cab be chlorine (Cl), bromine (Br) or iodine (I), and a mixture of at least two of these compounds. The matrix is made of an at least partly transparent material. The matrix is for example made of silica. The matrix is for example made of any at least partly transparent plastic material, particularly of an at least partly transparent polymer, particularly of silicone, of polyacetic acid (PLA), of acrylic polymers, for example poly(methyl methacrylate) (PMMA). The matrix may be made of an at least partly transparent polymer used with three-dimensional printers, such as PLA.

Reflective layer 142 may be made of a conductive material, for example a metal such as aluminum, silver, copper, or zinc.

FIGS. 8A to 8M are partial simplified cross-section views of structures obtained at successive steps of an example of a method of manufacturing optoelectronic device 100 of FIG. 6 or 7.

Figure 8A:
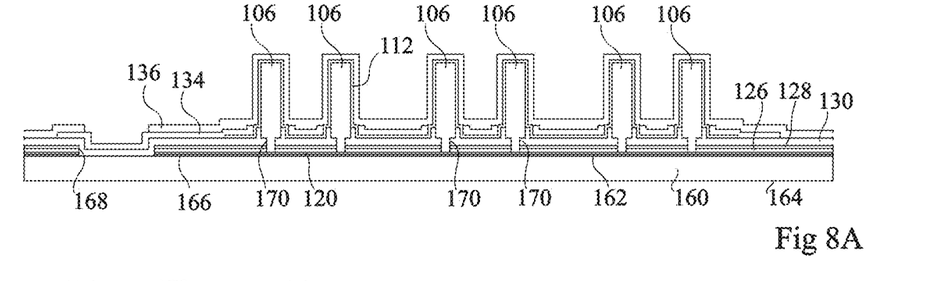
FIGS. 8A to 8M are partial simplified cross-section views of structures obtained at successive steps of an example of a method of manufacturing the optoelectronic device of FIG. 6.
Figure 8B:
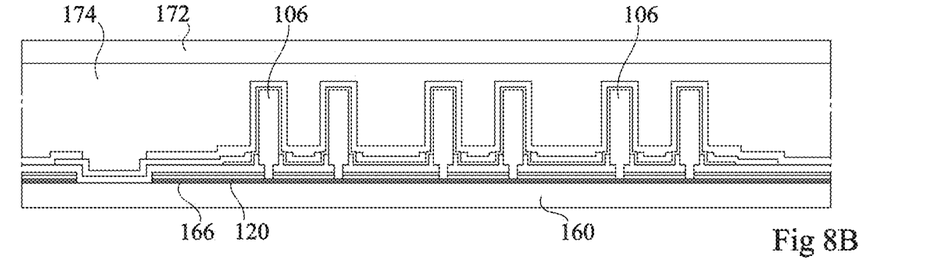
Figure 8C:
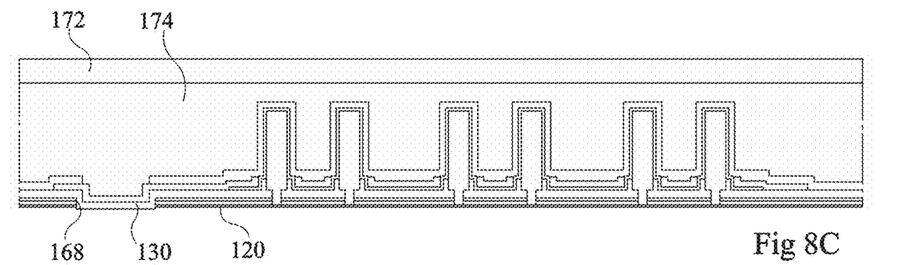
Figure 8D:
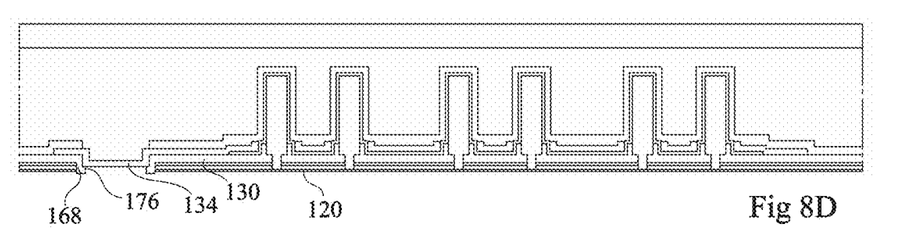
Figure 8E:
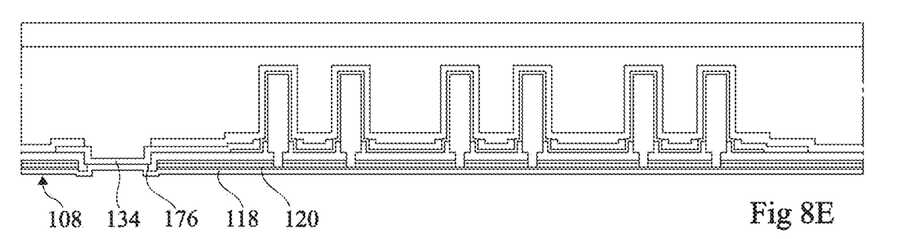
Figure 8F:
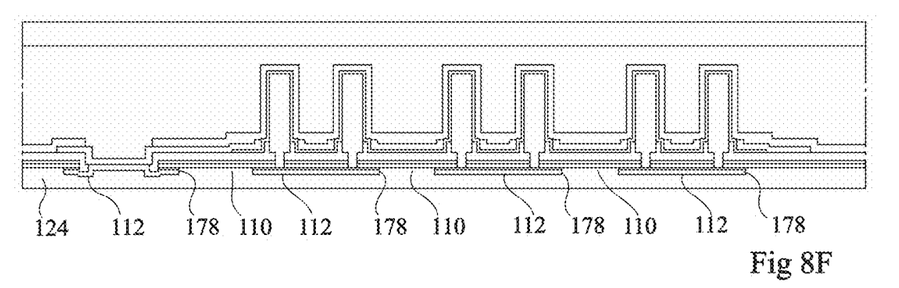
Figure 8G:
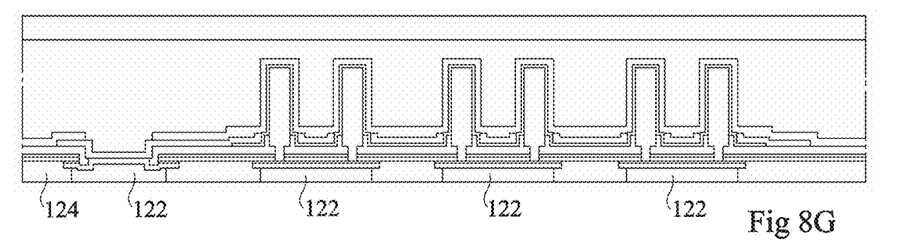
Figure 8H:
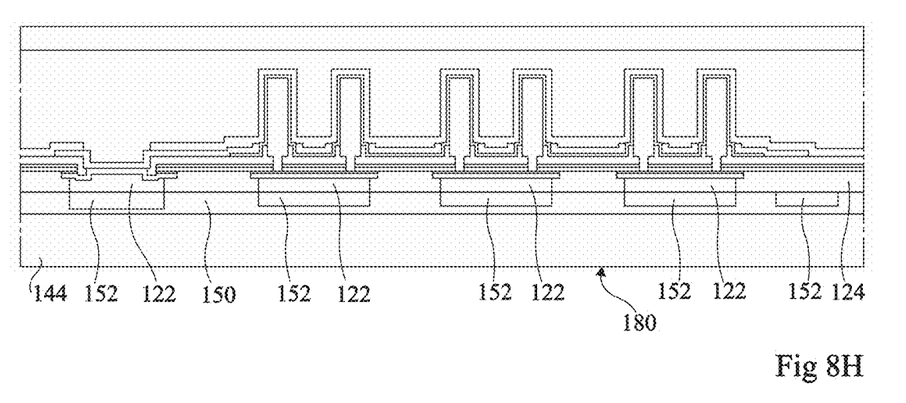
Figure 8I:
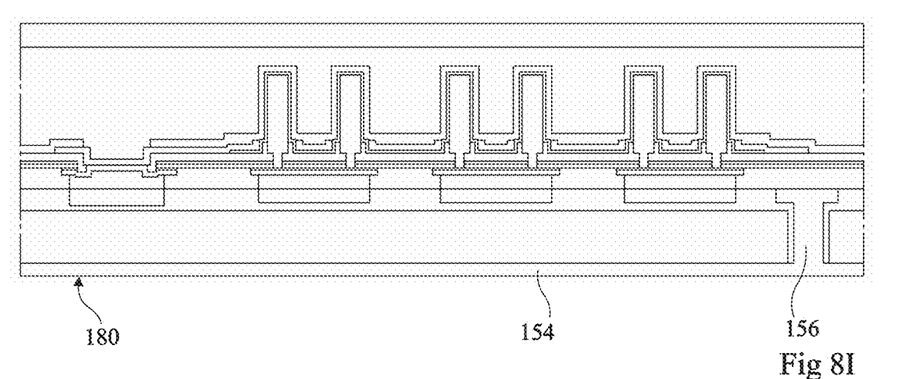
Figure 8J:
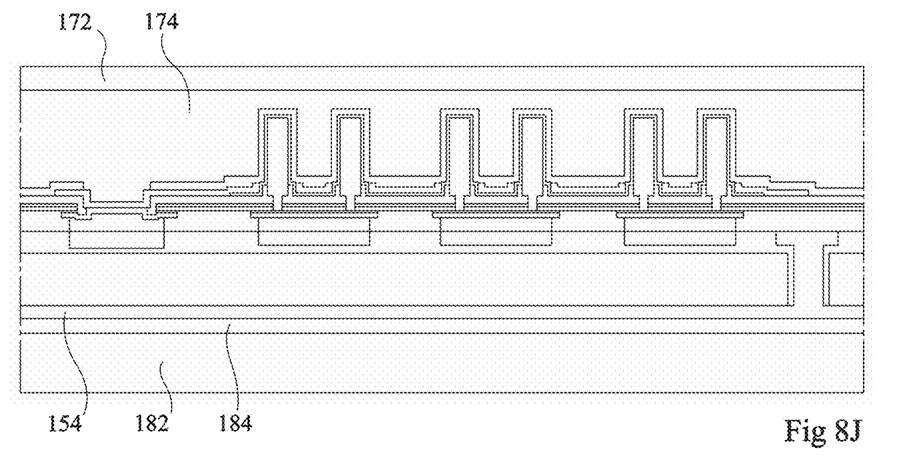
Figure 8K:
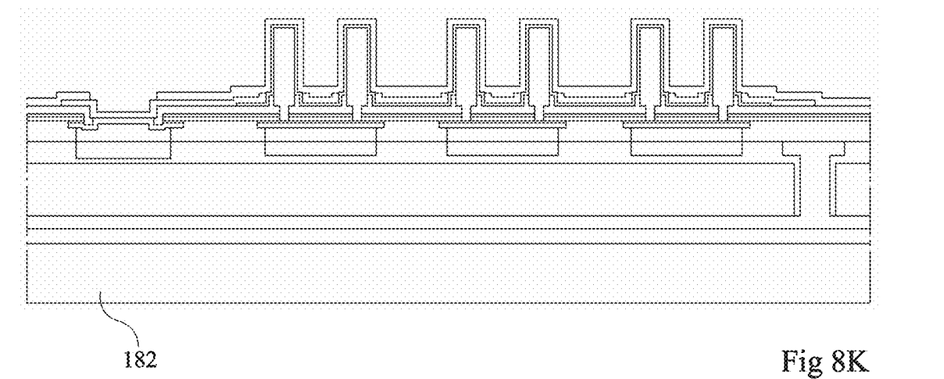
Figure 8L:
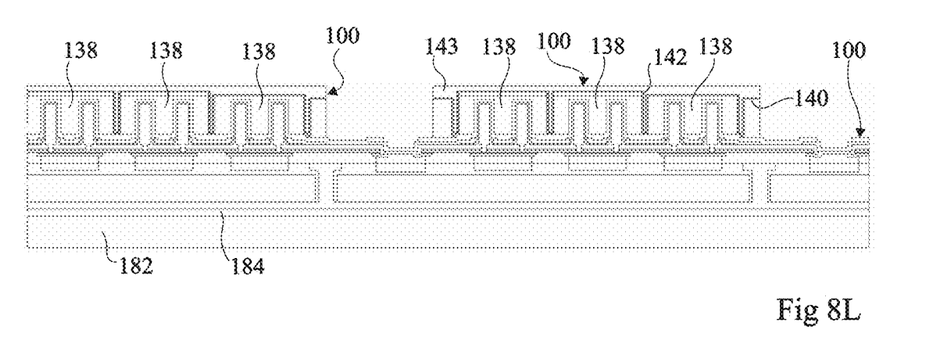
Figure 8M:
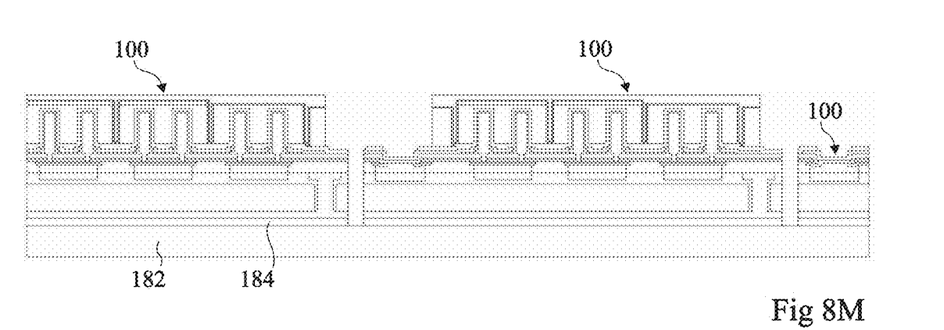

An embodiment of a method of manufacturing optoelectronic device 100 of FIG. 6 comprises the successive following steps:

a) Providing a substrate 160 having two opposite faces 162, 164 and forming simultaneously several copies of optoelectronic circuit 102 on substrate 160. (FIG. 8A), in particular, forming a stack of seed layers on face 162, two seed layers 166, 120 being shown on FIG. 8A, forming the stack of insulating layers 126, 128 on the stack of seed layers 166, 120, forming, for each copy of optoelectronic circuit 102, an opening 168 through insulating layers 126, 128 and through seed layers 166, 120 to expose a part of substrate 160, forming insulating layer 130 on insulating layer 128 and on substrate 160 in opening 168, forming openings 170 through insulating layers 126, 128, 134 to expose parts of seed layer 120, forming light-emitting diodes 106 in contact with seed layer 120 through openings 170, forming conductive layers 132 and 134 and forming insulating layer 136. Substrate 160 can correspond to a monolithic semiconductor substrate. Semiconductor substrate 160 is, for example, a substrate made of silicon, of germanium, or of a III-V compound such as GaAs. Preferably, substrate 160 is a single-crystal silicon substrate. Seed layer 166 can be made of the same materials previously disclosed for seed pads 54.

b) Bonding the structure obtained at step a), from the side of light-emitting diodes 16, to a handle 172, for example a glass handle or a silicon wafer, by bonding medium 174, for example glue (FIG. 8B).

c) Etching completely substrate 160 and seed layer 166 to expose, for each copy of optoelectronic circuit 102, seed layer 120 and insulating layer 130 in opening 168 (FIG. 8C). This can be done by grinding, dry etching and/or wet etching.

d) Forming, for each copy of optoelectronic circuit 102, opening 176 in insulating layer 130 to expose conductive layer 134 (FIG. 8D).

e) Forming conductive layer 118 covering seed layer 120 and in contact with conductive layer 134 in opening 176 for each copy of optoelectronic circuit 102 (FIG. 8E). Conductive layer 118 and seed layer 120 form substrate 108. Conductive layer 118 can have a multilayer structure, for example a Ti/TiN/AlSi stack structure.

f) Forming openings 178 in substrate 108 to delimit substrate portions 112 and forming insulation elements 110 in openings 178 and insulating layer 124 covering substrate portions 112 (FIG. 8F).

g) Forming conductive pads 122 in insulating layer 124 (FIG. 8G). In an embodiment, conductive pads 122 are formed by a damascene process that comprises the formation of openings in insulating layer 124, the deposit of a conductive layer, for example a copper layer, on the whole structure and in particular in the openings, and the planarization of the conductive layer, for example CMP, in order to obtain a flat face exposing conductive pads 122 and insulating layer 124 between pads 122. The same damascene process can be used to form a flat side for control chip 104. The damascene process is particularly adapted to perform a direct heterogeneous bonding.

h) Forming a circuit 180 comprising several copies of control circuit 104, except for conductive layer 154 and via 156, bonding circuit 180 to the structure obtained in step g), for example by molecular bonding, and thinning substrate 144 of circuit 180 (FIG. 8H). Most of conductive pads 152 are bonded to conductive pads 112 and insulating layer 150 is bonded to insulated layer 124.

i) Forming in circuit 180, for each copy of control circuit 104, conductive layer 154 and via 156 (FIG. 8I). For the variation shown on FIG. 7, vias 156 and 157 can be formed simultaneously and conductive layer 154 can be etched to form pads 158 and 159.

j) Bonding the structure obtained at step i), from the side of conductive layer 154, to a handle 182, for example a glass handle or a silicon wafer, by bonding medium 184, for example glue (FIG. 8J).

k) Removing handle 172, for example by a laser debonding method, and removing bonding medium 174, for example by etching (FIG. 8K)

l) Forming photoluminescent blocks 138, electrically insulating layer 140, reflective layer 142, and insulating layer 143 (FIG. 8L). A complete copy and two partial copies of optoelectronic device 100 are shown of FIG. 8L.

m) Separating optoelectronic devices 100, for example by a dicing method (FIG. 8M).

Various embodiments with various variations have been described hereabove. It should be noted that those skilled in the art may combine these various embodiments and variations without showing any inventive step. As an example, the structure of optoelectronic device 90 shown in FIGS. 5A and 5B may be used with the structure of optoelectronic device 80 shown in FIGS. 4A, 4B, and 4C.

What is claimed is:

1. An optoelectronic device comprising:
a substrate comprising first and second opposite surfaces,
lateral electric insulation elements extending from the first surface to the second surface and delimiting in the substrate first semiconductor or conductive portions electrically insulated from one another,
the optoelectronic device further comprising, for each first semiconductor or conductive portion,
a first conductive pad on the second surface in contact with the first semiconductor or conductive portion and a light-emitting diode or an assembly of light-emitting diodes resting on the first surface and electrically connected to the first semiconductor or conductive portion,
the optoelectronic device further comprising a conductive and at least partially transparent electrode layer extending across a plurality of the first semiconductor or conductive portions and covering the light-emitting diodes,
an insulating and at least partially transparent encapsulation layer covering the electrode layer, and
at least one second conductive pad electrically connected to the electrode layer.

2. The optoelectronic device of claim 1, wherein each light-emitting diode comprises at least one wire-shaped, conical, or tapered semiconductor element integrating or covered at the top and/or at least on a portion of its lateral surfaces with a shell comprising at least one active layer capable of supplying most of the radiation of the light-emitting diode.

3. The optoelectronic device of claim 1, further comprising a conductive layer covering the electrode layer around the light-emitting diodes of each assembly.

4. The optoelectronic device of claim 1, wherein the lateral electric insulation elements comprise at least one insulating wall extending in the substrate from the first surface to the second surface.

5. The optoelectronic device of claim 1, wherein the lateral electric insulation elements further delimit, in the substrate, a second semiconductor or conductive portion electrically insulated from the first semiconductor or conductive portions and electrically connected to the electrode layer.

6. The optoelectronic device of claim 5, wherein the second conductive pad is in electric contact with the second semiconductor or conductive portion on the side of the second surface.

7. The optoelectronic device of claim 1, wherein the second conductive pad is located on the side of the first surface.

8. The optoelectronic device of claim 1, wherein the substrate comprises silicon, germanium, silicon carbide, or a III-V compound.

9. The optoelectronic device of claim 8, wherein the substrate comprises single-crystal silicon and further comprises a dopant concentration in the range from $5*10^{16}$ atoms/cm$^3$ to $2*10^{20}$ atoms/cm$^3$.

10. The optoelectronic device of claim 1, wherein each light-emitting diode or an assembly of light-emitting diodes comprises a III-V compound or a II-VI compound.

11. The optoelectronic device of claim 1, comprising lenses on the encapsulation layer.

12. The optoelectronic device of claim 1, wherein the optoelectronic device is a display screen or a projection device.

13. The optoelectronic device of claim 1, wherein the substrate is a semiconductor substrate.

14. The optoelectronic device of claim 1, wherein the substrate is a conductive substrate.

15. The optoelectronic device of claim 1, comprising:
a first circuit comprising said semiconductor or conductive portions, said first conductive pads, said light-emitting diodes, said electrode layer and said encapsulation layer and said second conductive pad; and a second circuit in contact with the first circuit on the side of said first conductive pads and electrically linked to the light-emitting diodes.

16. The optoelectronic device of claim 15, wherein the first circuit comprises a first flat face exposing said first conductive pads and the second circuit comprises a second flat face, the second circuit being in contact with the first circuit only through the second face being in contact with the first face.

17. A method of manufacturing an optoelectronic device comprising the steps of:
a) forming, in a substrate comprising first and second opposite surfaces, lateral electric insulation elements extending from the first surface to the second surface and delimiting in the substrate first semiconductor or conductive portions electrically insulated from one another and forming, for each first semiconductor or conductive portion, a first conductive pad on the second surface in contact with the first semiconductor or conductive portion;
b) forming, for the first semiconductor or conductive portion, a light-emitting diode or an assembly of light-emitting diodes resting on the first surface and electrically connected to the first semiconductor or conductive portion; and
c) forming a conductive and at least partially transparent electrode layer that extends across a plurality of the first semiconductor or conductive portions and that covers the light-emitting diodes, an encapsulation layer made of an at least partially transparent dielectric material covering the electrode layer, and at least one second conductive pad electrically connected to the electrode layer.

18. The method of claim 17, wherein step a) comprises the steps of:
before step b), forming, in the substrate, lateral electric insulation elements extending from the first surface down to part of the substrate depth; and
after step c), thinning the substrate to form the second surface and expose the lateral electric insulation elements on the second surface.

19. The method of claim 17, further comprising depositing phosphors on at least some of the light-emitting diodes.

20. The method of claim 17, wherein each light-emitting diode comprises at least one wire-shaped, conical, or tapered semiconductor element integrating or covered at the top and/or at least on a portion of its lateral surfaces with a shell comprising at least one active layer capable of supplying most of the radiation of the light-emitting diode.

21. The method of claim 17, wherein the substrate is a semiconductor substrate.

22. The method of claim 17, wherein the substrate is a conductive substrate.

23. The method of claim 17, comprising:
forming a first circuit comprising said semiconductor or conductive portions, said first conductive pads, said light-emitting diodes, said electrode layer and said encapsulation layer and said second conductive pad; and
contacting a second circuit to the first circuit on the side of said first conductive pads.

24. The method of claim 23, wherein said first conductive pads are made by a damascene process and the second circuit is in contact with the first circuit by direct heterogeneous bonding.

* * * * *